United States Patent
Ranucci

(10) Patent No.: US 6,858,917 B1
(45) Date of Patent: Feb. 22, 2005

(54) METAL OXIDE SEMICONDUCTOR (MOS) BANDGAP VOLTAGE REFERENCE CIRCUIT

(75) Inventor: Paul David Ranucci, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/730,201

(22) Filed: Dec. 5, 2003

(51) Int. Cl.[7] .................... H01L 27/082; H01L 29/00
(52) U.S. Cl. .................. 257/580; 257/581; 257/572; 257/561; 257/562; 257/563; 257/564; 361/56
(58) Field of Search ................... 361/56; 257/580, 257/581, 572, 561, 562–564

(56) References Cited

U.S. PATENT DOCUMENTS 5,224,134 A * 6/1993 Miwada ................. 377/60
2003/0048588 A1 * 3/2003 Duvvury et al. ............ 361/56

* cited by examiner

*Primary Examiner*—Jerome Jackson
*Assistant Examiner*—Joseph Nguyen
(74) *Attorney, Agent, or Firm*—Vedder Price Kaufman & Kammholz, P.C.

(57) ABSTRACT

A metal oxide semiconductor (MOS) bandgap voltage reference circuit with a plurality of dummy bipolar junction transistors (BJTs) coupled to the mismatched parasitic substrate BJTs for improving parasitic capacitance matching, thereby improving startup behavior of the bandgap reference circuitry.

9 Claims, 4 Drawing Sheets

METAL OXIDE SEMICONDUCTOR (MOS) BANDGAP VOLTAGE REFERENCE CIRCUIT

BACKGROUND OF THE INVENTION

1. Field of the Invention

The present invention relates to bandgap voltage generators, and in particular, to bandgap voltage generators using metal oxide semiconductor (MOS) devices.

2. Description of the Related Art

Bandgap voltage generator circuits are well known in the art and can be implemented using many circuit topologies. As is well known, the circuit relies on two transistors (generally implemented as two groups of mutually interconnected transistors) running at different emitter current densities, with the current-rich transistor typically running at ten or more times the density of the current-lean transistor. Such a factor of ten or more will cause a 60-millivolt difference between the base-emitter voltages Veb of the two transistors/groups. This difference voltage is then typically amplified by a corresponding factor of ten or more and added to another base-emitter voltage. The total of these two voltages add up to approximately 1.22 volts, which is approximately the bandgap of silicon.

Present bandgap voltage generators now typically use MOS devices as part of a larger MOS circuit. However, as is well known, many implementations of MOS devices result in the creation of parasitic bipolar junction transistors which can produce undesirable parasitic effects, such as circuit latchup or parasitic capacitance which affects circuit startup and operation.

SUMMARY OF THE INVENTION

In accordance with the presently claimed invention, a metal oxide semiconductor (MOS) bandgap voltage reference circuit includes a plurality of dummy bipolar junction transistors (BJTs) coupled to the mismatched parasitic substrate BJTs for improving parasitic capacitance matching, thereby improving startup behavior of the bandgap reference circuitry.

In accordance with one embodiment of the presently claimed invention, a metal oxide semiconductor (MOS) bandgap voltage reference circuit includes MOS bandgap voltage generator circuitry and a plurality of dummy transistors. The MOS bandgap voltage generator circuitry includes: first and second parasitic substrate transistor circuits with first and second base terminals, first and second emitter terminals, first and second collector terminals, and first and second emitter areas, respectively; and a first resistance coupled between the first and second base terminals. The first emitter area is greater than the second emitter area and one of the first emitter and collector terminals is mutually coupled with a like one of the second emitter and collector terminals. The plurality of dummy transistors includes mutually coupled base terminals coupled to the second base terminal, and mutually coupled emitter terminals and mutually coupled collector terminals coupled to the mutually coupled first and second parasitic substrate transistor circuit terminals.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
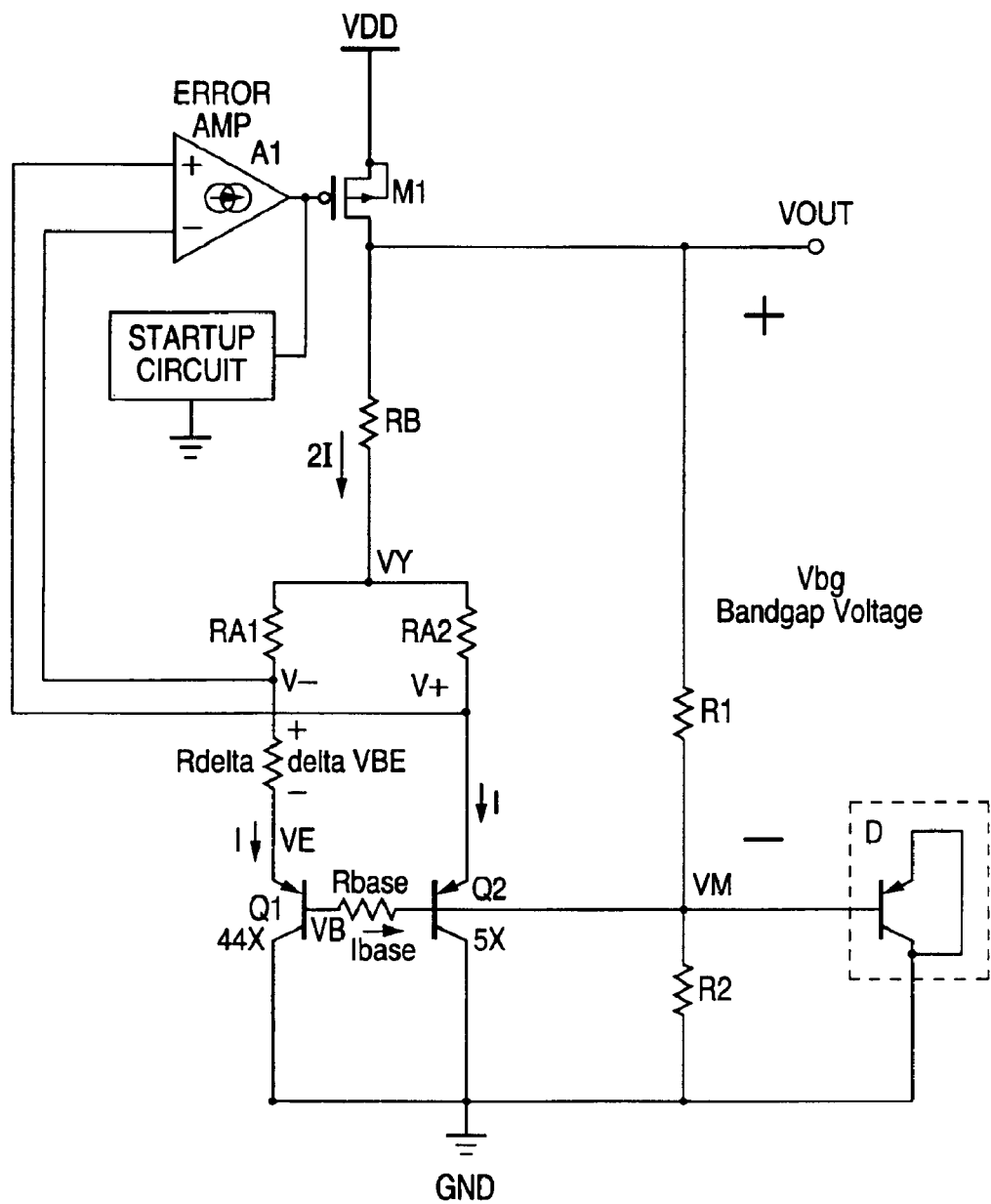
FIG. 1 is a schematic diagram of a MOS bandgap voltage reference circuit with compensation for parasitic capacitances of the substrate bipolar junction transistors (BJTs) used for generating the bandgap voltage in accordance with one embodiment of the presently claimed invention.

Referring to FIG. 1, one example of a bandgap voltage generator circuit which can be compensated in accordance with the presently claimed invention is a common form of circuit often referred to as a "Brokaw bandgap circuit." Such a circuit is implemented using complementary MOS devices with mismatched parasitic substrate PNP BJTs Q1, Q2. A differential amplifier A1 controls the gate terminal of a P-type MOS transistor M1 which serves as a controllable current source. This causes a channel current to flow in transistor M1 such that node voltages V+, V− at the lower terminals of resistors RA1 and RA2 are equal. Resistors RA1 and RA2 are equal, thereby causing the currents I through transistors Q1 and Q2 to be equal. In the event that the node voltages V+, V− begin to differ, the differential amplifier action of the error amplifier A1 will cause the source current 2I to be modified such that these voltages V+, V− remain equal.

As a result, the voltage across resistor Rdelta at the emitter terminal of transistor Q1 can be as expressed below in Equation 1:

$$Vrdelta = Veb2 - Veb1 - Ibase \cdot Rbase \qquad \text{Eq. 1}$$

The currents I in transistors Q1 and Q2 are equal, therefore the difference in their respective emitter-base voltages Vbe1, Vbe2 can be expressed as follows (where VT is the thermal voltage, and A1 and A2 are the respective emitter areas of transistors Q1 and Q2):

$$Veb2-Veb1=VT*\ln(A1/A2) \qquad \text{Eq. 2}$$

A base current Ibase is expressed below in Equation 3:

$$Ibase(Q1)=I/beta(Q1) \qquad \text{Eq. 3}$$

Thus, the voltage across resistor Rdelta is as expressed below in Equation 4 (where emitter areas 44 and 5 for this example have been substituted for A1 and A2, respectively):

$$Vrdelta=VT*\ln(44/5)-1*Rbase/beta(Q1) \qquad \text{Eq. 4}$$

A voltage across resistor Rdelta is also equal to:

$$Vrdelta=I*Rdelta \qquad \text{Eq. 5}$$

Setting Equations 4 and 5 equal to each other allows the current parameter I to be isolated and expressed as:

$$I=VT*\ln(44/5)/(Rdelta+Rbase/beta(Q1)) \qquad \text{Eq. 7}$$

Assuming that the resistances and the beta of transistor Q1 do not vary greatly with temperature, the current I is a PTAT (proportional to absolute temperature) current. Solving for the voltage difference between the output voltage Vout and node voltage VM:

$$Vbg=Vout-VM=Veb2+I*(RA2+2*RB) \qquad \text{Eq. 8}$$

The emitter-base voltage Veb2 of transistor Q2 will decrease approximately 2 millivolts per degree Celsius, so a value of (RA2+2RB) can be selected such that the voltage difference between the output voltage Vout and node voltage VM will not vary linearly with temperature. This voltage difference Vbg between the output voltage Vout and node voltage VM in such case is approximately equal to the bandgap voltage of silicon (1.22 volts).

The current through resistor R2 in the resistive output circuit is equal to:

$$I(R2)=Vbg/R1+2*Ibase \qquad \text{Eq. 9}$$

By multiplying this current I(R2) by the resistance R2 and adding the resulting voltage to the bandgap voltage Vbg, the output voltage Vout can be computed:

$$Vout=Vbg(1+R2/R1)+2*Ibase*R2 \qquad \text{Eq. 10}$$

Solving for the bandgap voltage Vbg in terms of the remaining circuit voltages and substituting this into Equation 10 yields:

$$Vout=(1+R2/R1)*[(Vbe2+VT*\ln(44/5)*(RA2+2RB)/Rdelta)+ \\ Ibase*(2*R1/R2-Rbase*(RA2+2RB)/Rdelta)] \qquad \text{Eq. 11}$$

This equation shows that the term Ibase for the current through the base resistance Rbase can be eliminated by proper selection of the value for the base resistance Rbase (this base resistance Rbase is used for base current compensation for transistors Q1 and Q2):

$$Rbase=2*R1/R2*Rdelta/(RA2+2RB) \qquad \text{Eq. 12}$$

Equation 10 then reduces to:

$$Vout=Vbg*(1+R2/R1) \qquad \text{Eq. 13}$$

This circuit has two stable operating points: one in which the output voltage Vout is as expressed in Equation 13, and the other in which the output voltage is zero volts. To avoid the operating state of Vout=0 volts, this circuit must be started up or forced to reach the desired operating condition (as per Equation 13). A common technique for doing this is using a startup circuit to pull down the gate terminal of the source current transistor M1 so as to force transistor M1 to begin conducting and supplying current to the circuit. After a predetermined time interval has elapsed or a predetermined output voltage Vout has been achieved, the startup circuit returns control to the amplifier A1.

Included as part of this bandgap voltage generator circuit, as discussed in more detail below, is a group of "dummy" transistors D for providing compensation for parasitic capacitances associated with the substrate transistors Q1, Q2.

Figure 1A:
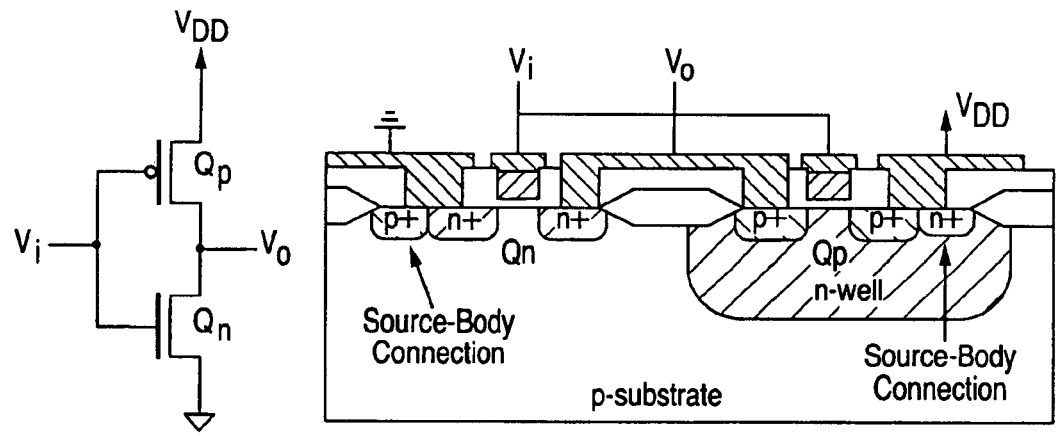
FIGS. 1A and 1B illustrate cross-sectional views of an integrated circuit containing MOS transistors in which parasitic substrate BJTs are formed.
Figure 1B:
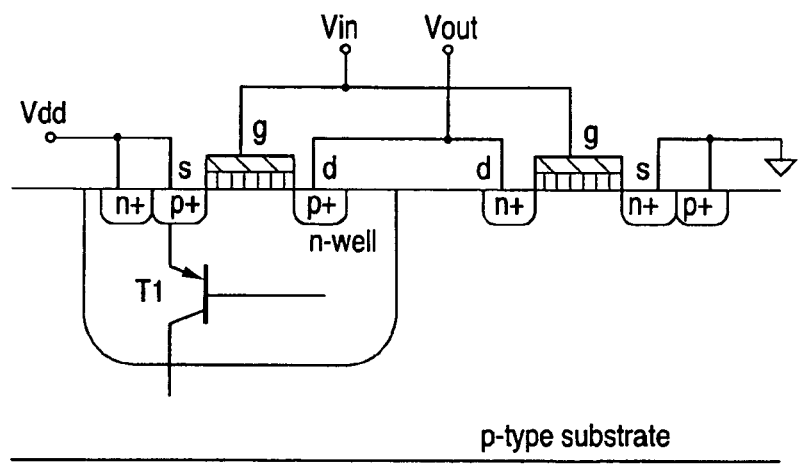

Referring to FIGS. 1A and 1B, parasitic substrate transistors, such as those transistors Q1, Q2 used in the circuit of FIG. 1 for generating the bandgap voltage, are often formed as a result of the fabrication of MOS transistors. As is shown, in this case using a typical complementary MOS transistor inverter circuit as an example, an N-well is implanted or diffused within a P-substrate, followed by implantation or diffusion of additional P+ and N+ regions for creating the P-type and N-type MOS transistors in accordance with well known semiconductor fabrication techniques. The P-substrate forms the collector of a vertical PNP transistor T1. The N-well acts as the base of the PNP transistor T1. The P+ sources and drains of the P-channel MOS transistor serve as the emitter of the PNP transistor T1. The N-well is normally connected to the power supply voltage VDD, the most positive circuit voltage, via an N+ diffusion tab, while the substrate is terminated at circuit ground GND, the most negative circuit voltage, through a P+ diffusion. In the present case, the N-well is not connected to the highest potential, but is instead used as the base terminal of the vertical PNP transistor T1. (With the substrate typically at circuit ground potential, no functional lateral NPN transistor will be produced.)

Figure 2:
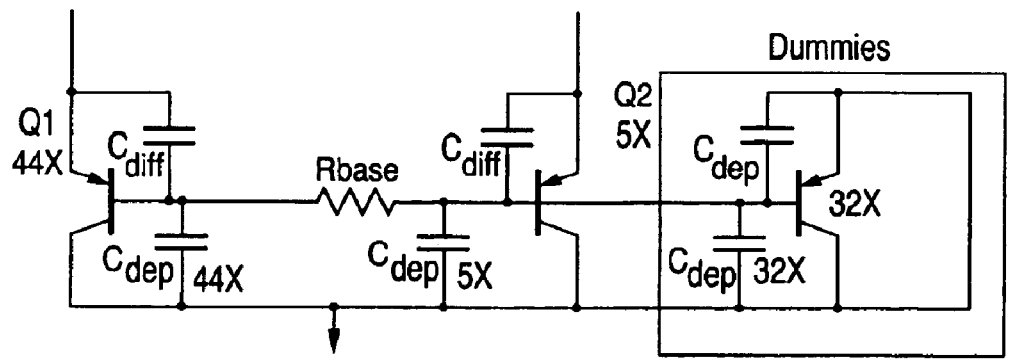
FIG. 2 is a schematic diagram illustrating in more detail the introduction of dummy transistors for providing compensation in accordance with one embodiment of the presently claimed invention.

Referring to FIG. 2, the substrate transistors Q1, Q2 have at least two types of parasitic capacitances associated with them. The capacitance Cdep between the base and collector terminals is a depletion capacitance which is proportional to the number of transistors in the composite transistor. Accordingly, transistor Q2, which is composed of a smaller number of devices (and thereby serves as the "current-rich device"), has a smaller depletion capacitance Cdep than transistor Q1. The capacitance Cdiff between the emitter and base terminals is a diffusion capacitance. When the circuit is starting up and the emitter voltages are low, the depletion capacitance Cdep dominates over the diffusion capacitance Cdiff. The diffusion capacitance Cdiff does not start affecting circuit operation until the emitter-base junction is sufficiently forward biased after startup.

Upon circuit startup, the base terminal of transistor Q2 will rise in voltage before the base terminal of transistor Q1 due to the difference in depletion capacitances Cdep, thereby causing unequal emitter currents to flow through transistors Q1 and Q2. This current imbalance causes a relatively large differential voltage at the input of the error amplifier A1 (FIG. 1), which can saturate the amplifier A1, thereby causing the output voltage Vout to overshoot the desired value and approach the value of the positive power supply voltage VDD.

A solution to this current imbalance caused by the parasitic depletion capacitances Cdep is to balance the respective depletion capacitances Cdep associated with the two transistors Q1, Q2 during initial startup conditions. This can be done by connecting inactive, i.e., dummy, transistors outside the array of transistors forming transistors Q1 and Q2. These dummy transistors will help with matching of the depletion capacitance Cdep between transistors Q1 and Q2, as well as add capacitance to output node VM (FIG. 1). Each dummy transistor would preferably have a similar depletion capacitance Cdep so as to help balance the two transistors Q1, Q2 such that one transistor base will not rise in voltage before the other. (The emitter-base capacitance of the dummy transistors is also a depletion capacitance Cdep since the emitter-base junction is reverse biased.)

Figure 3:
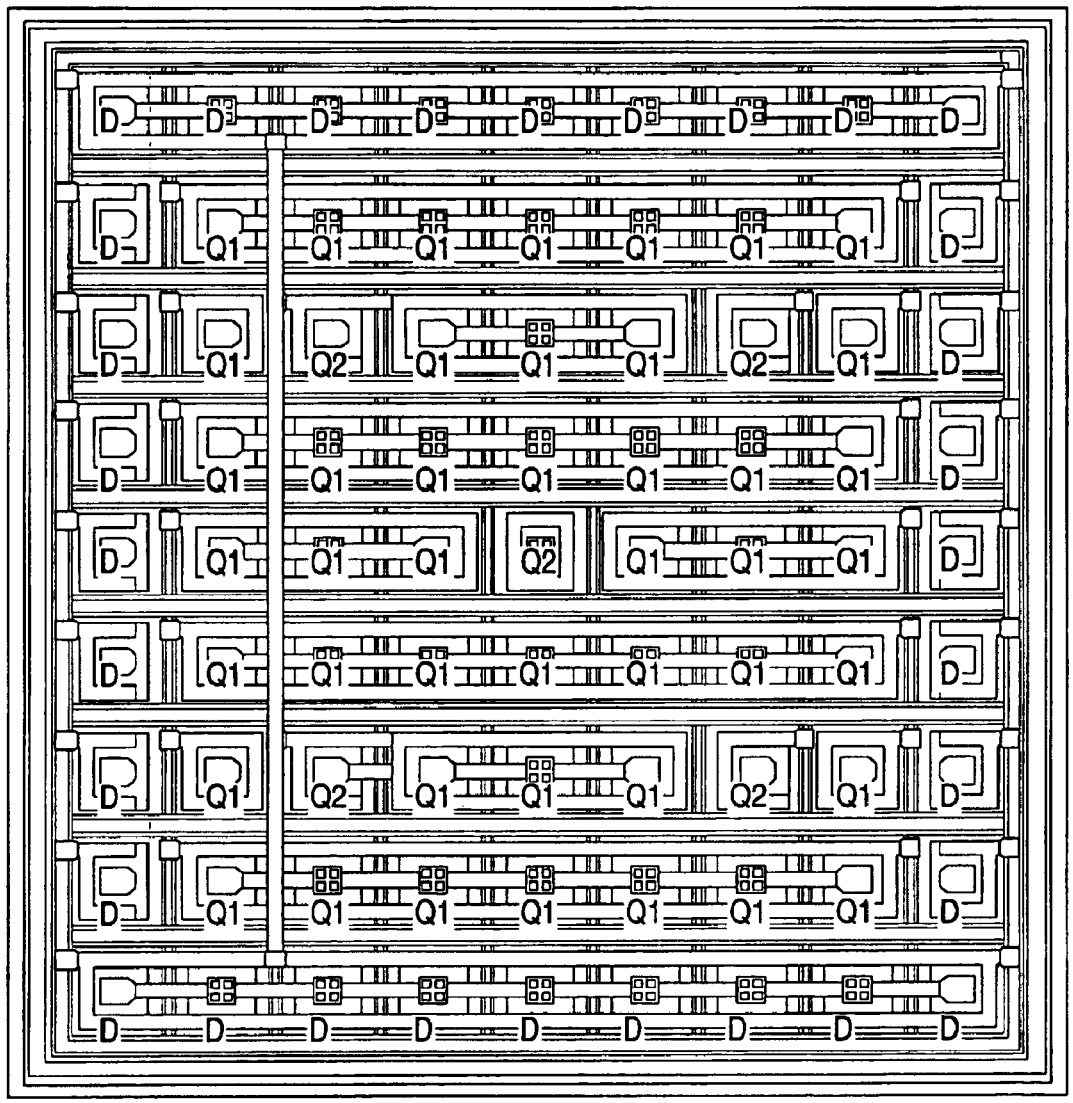
FIG. 3 is a plan view of a portion of an integrated circuit containing the substrate and dummy BJTs for providing compensation in accordance with one embodiment of the presently claimed invention.

Referring to FIG. 3, such a modification can be accomplished by providing the dummy transistor D in a substantially symmetrical array surrounding the periphery of the substantially symmetrical array formed by the transistors which collectively form the substrate transistors Q1, Q2, and does not require additional capacitors to be placed within the circuit. An additional benefit is that depletion capacitance added by the dummies will track the depletion capacitance Cdep of transistor Q2 and will not adversely affect the circuit after startup.

Figure 4:
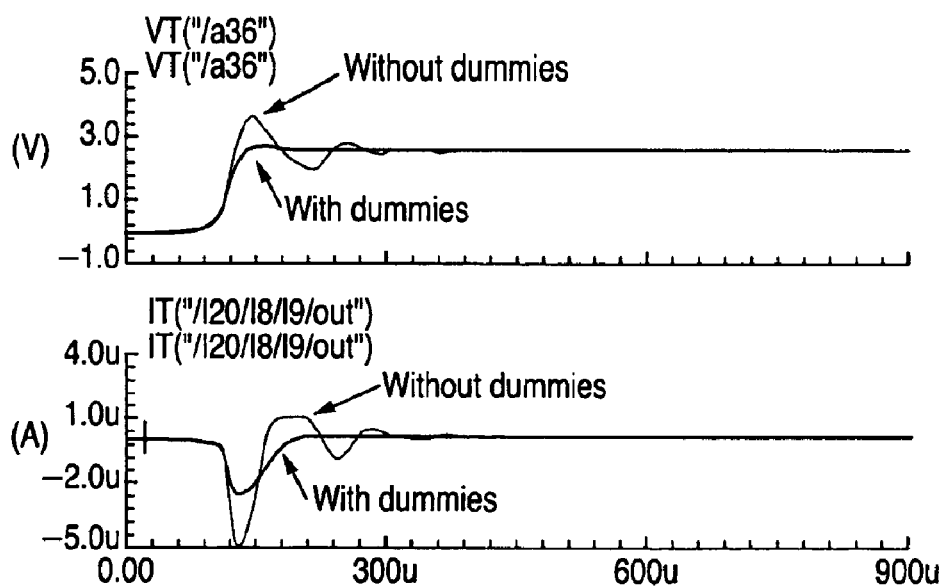
FIG. 4 is a signal timing diagram illustrating differences in performance of the circuit of FIG. 1 with and without the use of dummy transistors.

Referring to FIG. 4, the beneficial effect of avoiding overshoot of the output voltage Vout can be seen by comparing the transient responses of the output voltage Vout with and without the use of such dummy transistors.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a metal oxide semiconductor (MOS) bandgap voltage reference circuit, comprising:
    MOS bandgap voltage generator circuitry including
        first and second parasitic substrate transistor circuits with first and second base terminals, first and second emitter terminals, first and second collector terminals, and first and second emitter areas, respectively, and
        a first resistance coupled between said first and second base terminals,
        wherein said first emitter area is greater than said second emitter area and one of said first emitter and collector terminals is mutually coupled with a like one of said second emitter and collector terminals; and
        a plurality of dummy transistors with mutually coupled base terminals coupled to said second base terminal, and mutually coupled emitter terminals and mutually coupled collector terminals coupled to said mutually coupled first and second parasitic substrate transistor circuit terminals.

2. The apparatus of claim 1, wherein each one of at least a portion of said plurality of dummy transistors has an emitter area substantially equal to said second emitter area.

3. The apparatus of claim 1, further comprising startup circuitry coupled to said MOS bandgap voltage generator circuitry and responsive to an application of power to said MOS bandgap voltage generator circuitry by initiating first and second currents in said first and second parasitic substrate transistor circuits, respectively.

4. The apparatus of claim 1, wherein said MOS bandgap voltage generator circuitry comprises:
    MOS current source circuitry including a control terminal and first, second, third and fourth output terminals, and responsive to a control signal by providing an output voltage via said first output terminal, substantially equal first and second source currents via said second and third output terminals, and first and second source voltages via said third and fourth output terminals;
    said first parasitic substrate transistor circuit coupled to said second output terminal;
    said second parasitic substrate transistor circuit coupled to said third output terminal;
    amplifier circuitry coupled to said third and fourth output terminals and said control terminal, and responsive to said first and second source voltages by providing said control signal; and
    resistive circuitry coupled to said first output terminal, said second base terminal and said mutually coupled first and second parasitic substrate transistor circuitry terminals.

5. The apparatus of claim 4, wherein said MOS current source circuitry comprises:
    a MOS transistor coupled to said control terminal and said first output terminal;
    a second resistance coupled to said first output terminal;
    third and fourth resistances coupled to said second resistance and said third and fourth output terminals; and
    a fifth resistance coupled to said second and fourth output terminals.

6. The apparatus of claim 4, wherein:
    said first parasitic substrate transistor circuit comprises a first plurality of bipolar junction transistors;
    said second parasitic substrate transistor circuit comprises a second plurality of bipolar junction transistors, wherein said first and second collector terminals are mutually coupled;
    said first and second pluralities of bipolar junction transistors are integrated in a substantially symmetrical first array having a periphery; and
    said plurality of dummy transistors are integrated in a second array substantially adjacent at least a portion of said periphery.

7. The apparatus of claim 4, wherein:
    said first parasitic substrate transistor circuit comprises a first plurality of PNP bipolar junction transistors; and
    said second parasitic substrate transistor circuit comprises a second plurality of PNP bipolar junction transistors, wherein said first and second collector terminals are mutually coupled.

8. The apparatus of claim 4, wherein said amplifier circuitry comprises a differential amplifier circuit with first and second amplifier input terminals coupled to said third and fourth output terminals, respectively, and an amplifier output terminal coupled to said control terminal.

9. The apparatus of claim 4, wherein said resistive circuitry comprises:
    a second resistance coupled to said first output terminal and said second base terminal; and
    a third resistance coupled to said second base terminal and said mutually coupled first and second parasitic substrate transistor circuitry terminals.

* * * * *